United States Patent [19]

Kuze

[11] 4,363,960
[45] Dec. 14, 1982

[54] PHOTOELECTRIC WRITE-ONLY SEQUENCE CONTROLLER

[76] Inventor: Yoshikazu Kuze, 31-3, Higashi Magome 1-chome, Ohta-ku, Tokyo, 143, Japan

[21] Appl. No.: 201,392
[22] PCT Filed: Feb. 27, 1980
[86] PCT No.: PCT/JP80/00031
§ 371 Date: Oct. 28, 1980
§ 102(e) Date: Oct. 28, 1980
[87] PCT Pub. No.: WO80/01854
PCT Pub. Date: Sep. 4, 1980
[51] Int. Cl.³ .................. G06K 19/06; G06K 7/14; G11C 7/00
[52] U.S. Cl. .................. 235/454; 340/825.22
[58] Field of Search .............. 235/454, 466, 432, 487; 455/171; 340/825.22

[56] References Cited
U.S. PATENT DOCUMENTS
4,056,771 11/1977 Lamar .................. 235/454
4,177,377 12/1979 Kuze .................. 235/466
4,195,773 4/1980 Ogden .................. 235/487

Primary Examiner—Donald J. Yusko
Attorney, Agent, or Firm—Birch, Stewart, Kolasch & Birch

[57] ABSTRACT

Sequence controller for writing data into an EPROM and a film on which the data to be written is recorded. Film (1) is provided by printing clock marks (2) and R/W lines (3) on a transparent body and pasting opaque tapes onto data lines (4) according to a time chart to be written into the EPROM. Accordingly, the resultant data records are visible and it is easy to renew the data.

In the sequence controller, a synchronous clock pulse generator and gate devices operate so that the data are photoelectrically read out to be recorded in a RAM (59) in a short period of time as the film is passed along a path defined by a sheet reader (20) after the EPROM (30) has been mounted. Thereafter, the data is written into the EPROM. Thus, the sequence controller can be of a small size and easy to operate.

8 Claims, 14 Drawing Figures

4,363,960

PHOTOELECTRIC WRITE-ONLY SEQUENCE CONTROLLER

TECHNICAL FIELD

The present invention relates to a photoelectric write-only sequence controller provided with a program film or sheet as input means.

BACKGROUND ART

A conventional sequence controller having a writing means and a reading means is very unreasonable and expensive although it is used only for reading after the write-in of data. In order to remove such disadvantages, it is necessary be attempted to provide a sequence controller having a single function.

DISCLOSURE OF THE INVENTION

In accordance with the present invention, the sequence controller is divided into a write-only sequence controller and a read-only sequence controller. The write-only sequence controller is provided to write data in the read-only memory (EPROM) and the read-only sequence controller is provided with the EPROM and adapted to produce an output of data in the EPROM.

Since data may be written in a plurality of EPROMS by one write-only sequence controller, an economical control system may be provided.

Further, the conventional sequence controller is complicated to deal with a great variety of control objects and a skilled person is necessary for programming and modifying the data. In addition, the handling operation of the system is complicated, and a plurality of handling operations are required. For example, in order to program the data of 100 words×8 bits, key switches must be operated at least 200 times.

Accordingly, it is an object of the present invention to provide a sequence controller in which data programmings and modifications are very simple and easy for anybody having no special technical knowledge, and consequently secrets of the programming and modification may be maintained.

It is a further object of the present invention to provide a sequence controller which is of high fidelity, structured compactly and manufactured inexpensively.

To this end, a sequence control system of the present invention comprises a transparent program sheet bearing a plurality of data lines which are formed by any means such as adhesive attachment of opaque material and arranged in the longitudinal direction of the sheet.

The sequence controller allows a simple procedure of cutting and attaching opaque tape onto the transparent program sheet, and hence initial programming as well as modification of the program for any control sequence is extremely simple and easy.

The program sheet is inserted into the write-only sequence controller from one side, whereby machines may be controlled.

The sheet has a time chart formed by opaque adhesive tapes. The sheet is inserted into the device of the present invention and extracted. The data of 100 words×8 bits are written in a memory RAM built in the device, then the written data in the RAM is programmed automatically in an EPROM, after which the EPROM is removed.

The programmed EPROM is set in a read-only sequence controller, whereby various machines may be controlled.

The photoelectric write-only sequence controller of the present invention may be made into a light device having a weight of 450 gr and into a compact size. Thus, an economical controller may be provided for automatization of the machine and for energy saving.

BEST MODE FOR EMBODYING THE INVENTION

Figure 1:
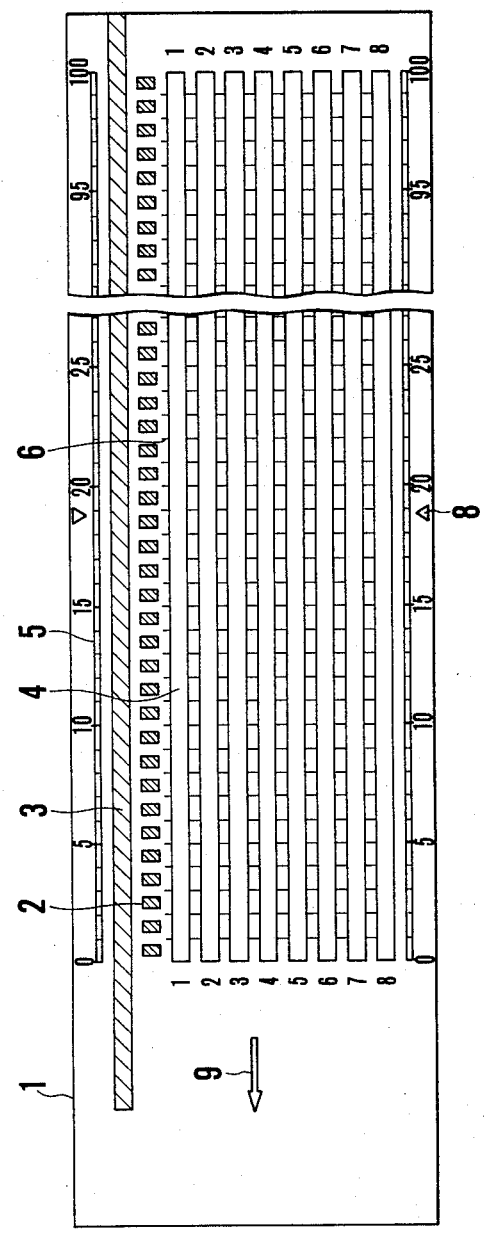
FIG. 1 shows a transparent program sheet of a sequence controller according to the present invention.

Referring to FIG. 1, numeral 1 is a transparent sheet, 2 are a plurality of write clock marks and 3 is an R/W line for generating signals for writing and reading which are printed by opaque ink; 4 designates a plurality of parallel data lines and 5 is a scale having one hundred indications. A plurality of indications 6 correspond to the scale 5.

Each indication 6 is in a central position between write clock marks 2, which aims to prevent any erroneous counting of data pulses; 8 is an index for positioning the sheet in a device body and 9 is an arrow showing an insertion direction of the sheet.

Figure 2:
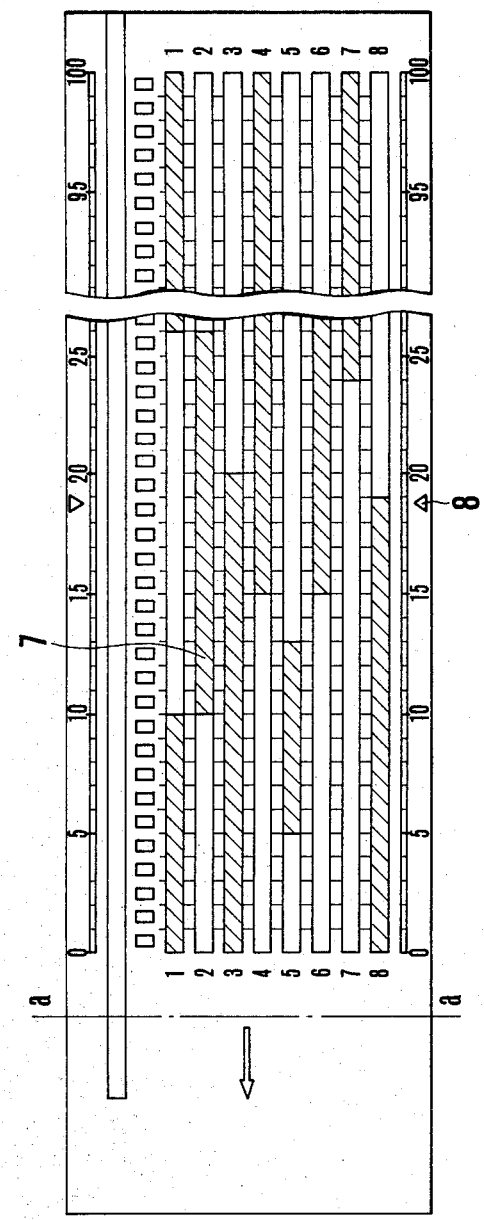
FIG. 2 shows a time chart attached by opaque tape onto the transparent program sheet.

FIG. 2 shows a sheet in which eight step time charts are provided by adhering opaque tapes. A dotted line a—a is an operational start line when the sheet is inserted into a sheet reader device as described hereinafter.

Figure 3:
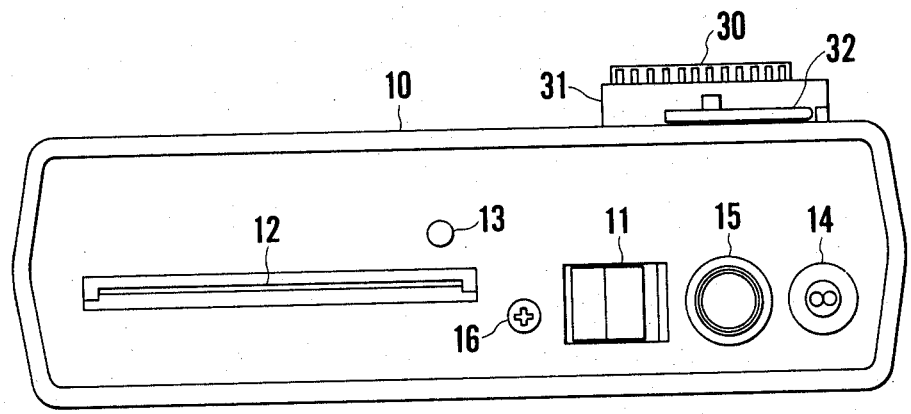
FIG. 3 shows a front view of the sequence controller.

FIG. 3 is a front view of the sequence controller of the present invention. Numeral 10 is a front panel, 11 is a power switch, 12 is a program sheet extracting slot, 13 is a pilot lamp, 14 is a supply cord, 15 is a fuse and 16 is a fastening screw.

Figure 4:
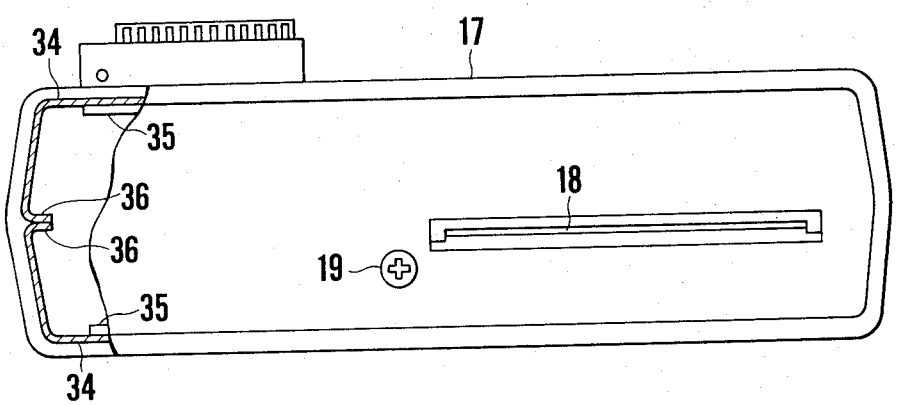
FIG. 4 shows a back view of the sequence controller.

FIG. 4 is a back view of the sequence controller; 17 is a back panel, 18 is a program sheet inserting slot and 19 is a fastening screw.

Figure 5:
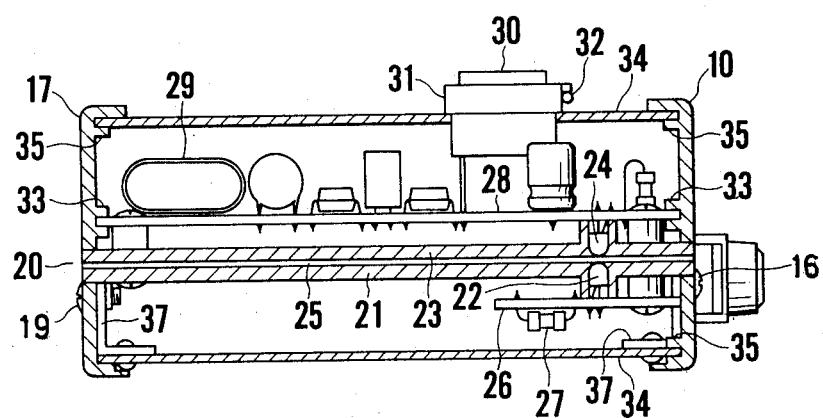
FIG. 5 shows a transverse cross-sectional view of the sequence controller.
Figure 6:
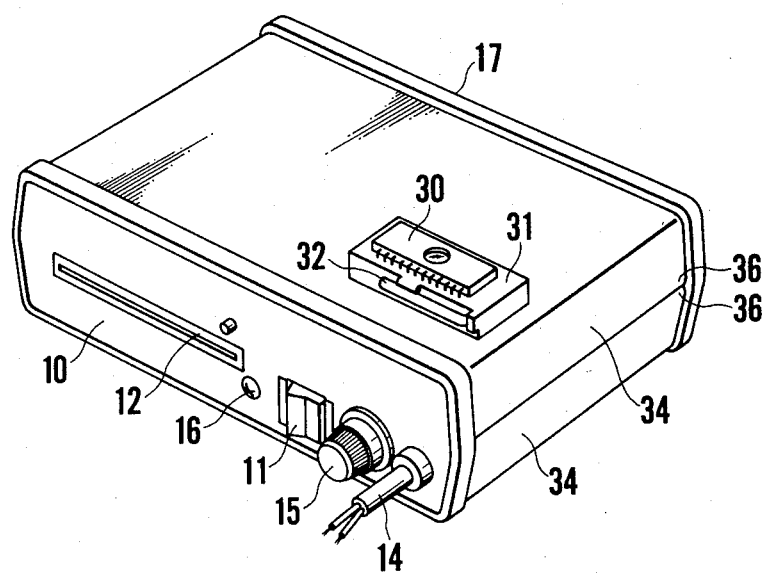
FIG. 6 is a perspective view of the sequence controller.

As shown in FIG. 5, a sheet reader 20 comprises a light emitting panel 21 having a plurality of light emitting elements 22 and a light receiving panel 23 having a plurality of light receiving elements 24 and both panels are engaged with a sliding inserting engagement so as to face each other and supported in grooves provided in panels 10, 17 to form a gap 25 for passing the program sheet. A printed wiring board 26 is secured to the light emitting panel 21, on which a resistor 27 for light emitting elements 22 is provided. Secured to the light receiving board 23, is a printed-wiring board 28 on which a memory, a gate, a crystal oscillator 29, a capacitance, resistors and an EPROM 30 having connector 31 are provided. The EPROM 30 is detachably fixed to the connector 31 by a lock lever 32 which is more clearly shown in FIG. 6.

As shown in FIG. 5, a pair of supporting projections 33 for the board 28 and projections 35 for covers 34 are formed in panels 10 and 17. Opposite end portions of each cover 34 are outwardly inclined and bent at ends 36 (FIGS. 4 and 6) to reinforce the portions. Both covers are abutted at bent ends 36 and supported between the supporting projections 35 and secured by L-shaped members 37 and screws 16 and 19.

Figure 7:
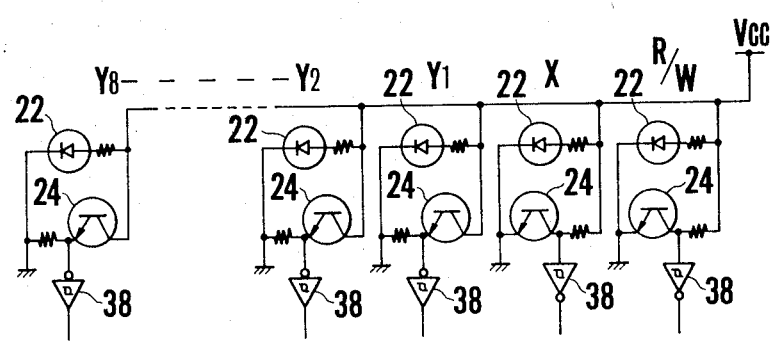
FIG. 7 shows a circuit of a photo-electric switching array of a sheet reader.

Referring to FIG. 7, the photo-electric switch array comprises a photo-electric switch unit R/W corresponding to the R/W line 3 in FIG. 1, photo-electric switch unit X corresponding to the write clock mark 2 and eight photo-electric switch units Y1, Y2 . . . Y8 corresponding to data lines 4. Output of each photo-electric switch unit is shaped by a Schmitt trigger 38. A photo-transistor 24 of each of the photo-electric switch unit R/W and photo-electric switch unit X is turned off when the light from the light emitting diode 22 to the photo-transistor 24 is interrupted by the opaque portion of the program sheet 1, so that the output of the circuit goes to a 1 and the output of the Schmitt trigger 38 goes to a 0. The photo transistor opposite the transparent portion of the sheet is turned on, so that the output of the Schmitt trigger 38 becomes a 1.

Each of the photo transistors of the photo-electric switch units Y1, Y2 . . . Y8 is of the emitter follower type. Accordingly, the output of the Schmitt trigger 38 opposite the opaque portion is 1 and the output corresponding to transparent portion is 0.

When the program sheet 1 is inserted into the device up to the indication 8, the light to light emitting diodes is interrupted, so that the output of the photo-electric switch unit R/W becomes 1 and the output of the Schmitt trigger 38 becomes 0. Thus, the device is changed to write-in mode.

When the program sheet is retracted and the phototransistor 24 of the switch unit R/W receives the light, the output of the switch unit R/W goes to 0 and the output of the Schmitt trigger 38 goes to a 1, so that the device is automatically changed to programming mode to EPROM as hereinafter described.

Figure 8:
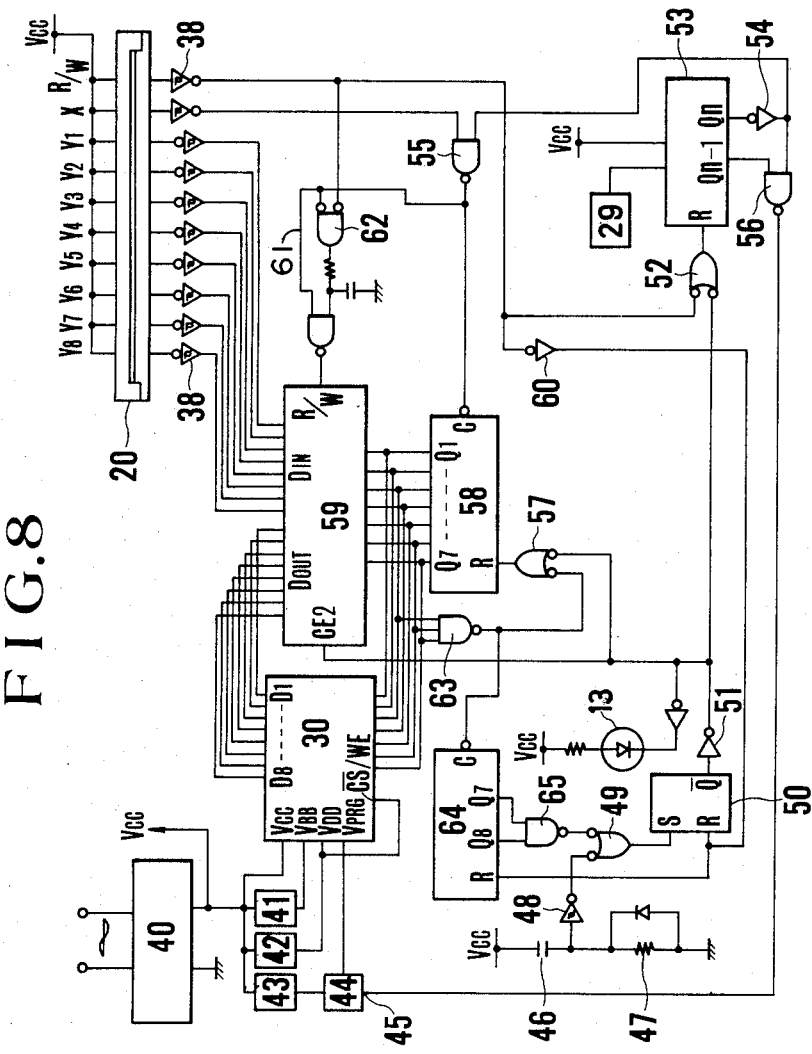
FIG. 8 shows a circuit of the present invention using an EPROM operated by three power supply sources.

Referring to FIG. 8, system supply voltage $V_{CC}$ is obtained by an AC/DC converter 40 and supply voltages $V_{BB}(-5\ V)$, $V_{DD}(+12\ V)$ and $V_{PRG}(+26\ V)$ are applied to an EPROM 30 from DC/DC converters 41, 42 and 43 through a control circuit 44.

When a signal "1" is applied to the input 45 of the control circuit 44, program pulses to the EPROM are cut off, and when the signal is 0, program pulses are supplied to the $V_{PRG}$ of the EPROM.

When the power switch 11 is turned on, the entire circuit is reset by a differentiation pulse from a differentiating circuit comprising a capacitance 46 and a resistor 47. More particularly, a differentiation pulse "1" is applied to a set input S of a flip-flop 50 through a 2-input NAND gate 49, so that the output $\overline{Q}$ goes to 1.

Thus;

A. Since a 1 is applied to a reset R of a binary counter 53 through an inverter 51 and 2-input NAND gate 52, all outputs are 0's. (When reset R=0, the binary counter 53 divides the output of the crystal oscillator 29 to produce a read clock pulse train from Qn and to produce a program pulses from Qn-1.)

Therefore, the read clock pulse train and program pulses disappear.

B. A 1 is applied to a reset R of a binary counter 58 through a 2-input NAND gate 57 to clear it.

C. A 0 is inputted in a chip-enable $CE_2$ to cause it to the non-selected state.

D. The program (pilot) lamp 13 is turned off. Under such a condition, the EPROM 30 is inserted into the connector 31 and secured by the lock lever 32.

Although the auto-reset circuit of FIG. 8 uses the differentiation pulse by the differentiating circuit, a differentiation pulse by an integrating circuit may be used.

Then, the program sheet 1 is inserted into the device from the opening 18 to the indication 8. The output of the photo-electric switch unit R/W is 0, which is write-in mode. That is, a 1 is inputted in the reset R of the flip-flop 50 through an invertor 60. Thus, the output of the invertor 51 changes to 1:

A. The input of $CE_2$ of the RAM 59 is changed to 1 to keep it in the selection state.

B. Inputs of a gate 57 are 1's, a reset R of a binary counter 58 is 0.

C. A 1 is inputted in a reset R of the binary counter 53 through a gate 52, so that outputs of the clock pulse train and program pulses are stopped during the write-in mode.

D. Inputs of NOR gate 62 of a differentiation pulse generating circuit 61 are changes to 0's, so that the gate is opened.

Thus, the write-in mode is completed. Then, the program sheet is retracted from the device. One hundred of clock pulses are inputted in the clock terminal C of the binary counter 58 through a gate 55 to address the corresponding address cells of the RAM 59 through address lines Q1, Q2 . . . Q7. On the other hand, the output of the gate 55 is applied to an input R/W of the RAM 59 through the differentiation pulse generating circuit 61 in synchronism with the clock pulse. By the R/W signal, eight steps data (FIG. 2) from photo-electric switch units are written in address cells of the RAM 59 which are addressed by the binary counter 58.

When one hundred clock pulses are counted in binary counter 58, the output of a 3-input NAND gate 63 will go to 0. That is, since binary number of one hundred is 1100100, address lines Q3, Q6, Q7 are 1's, so that the output of the 3-input NAND gate 63 goes to 0. Thus, a 1 is inputted the reset R of the binary counter 58 through the gate 57 to clear it.

When the R/W line 3 of the program sheet 1 passes the operating line of the photo-electric switch unit R/W, the output of the switch unit R/W will go to 1 to convert the system into the programming mode. More particularly, A. The output of the photo-electric switch unit X goes to 1 to thereby open the gate of the clock pulse control gate 55.

B. Since a 1 is inputted in the gate 62 of the differentiation pulse generating circuit 61, the R/W line of the RAM 59 is changed to 1 to close the data input $D_{IN}$ and to open the data output $D_{OUT}$.

C. Inputs of the gate 52 to 1's and the reset R of the binary counter 53 goes to 0. Accordingly, read clock pulses are generated from the gate 55 and program pulses are generated from the gate 56.

The read clock pulses are inputted in the binary counter 58 through the gate 55, so that address cells in the RAM 59 and EPROM 30 corresponding to address lines Q1, Q2 . . . Q7 are addressed. Data having been previously written in the RAM 59 are programmed in address cells in the EPROM 30 in synchronism with the program pulse.

When the binary counter 58 counts one hundred clock pulses, the output of the gate 63 will go to 0. Thus, a binary counter 64 counts one. Since a 0 is applied to the gate 57, the binary counter 58 is cleared. Accordingly, the binary counter 58 counts again the read clock pulses. At every cycle end, the binary counter 64 counts one.

For example, in the case that the program loop number from the RAM 59 to the EPROM 29 is 384, the binary number of 384 is 11000000. In this case, two inputs of the 2-input NAND gate 65 are connected to terminals Q7,Q8 of the binary counter 64. By such the connection, when the binary counter 64 counts 384 program loops, the output of the gate 65 will go to 0 which is inputted in the set input S of the flip-flop 50 through the gate 49.

Thus, the output $\bar{Q}$ of the flip-flop 50 goes to a 1:

A. The input of the gate 52 goes to 0 so that clock pulses and program pulses are stopped.
B. The binary counter 58 is cleared.
C. The $CE_2$ of the RAM 59 goes to 0, so that the RAM 59 becomes to non-selected state.
D. The pilot lamp 13 is turned off to indicate the completion of the program in the EPROM 30. Then the EPROM 30 is extracted.

Figure 9:
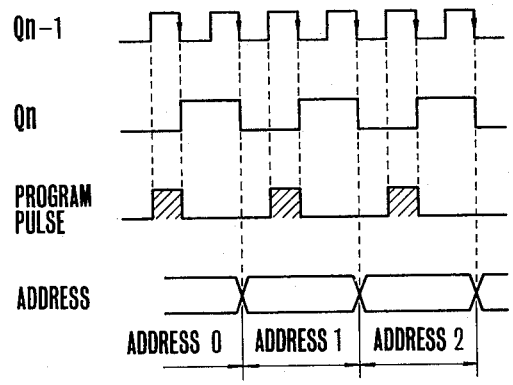
FIG. 9 is a timing diagram of program pulses.

FIG. 9 shows the timing diagram of the program pulse generating circuit. The program pulse shown by the hatching line is generated from the gate 56 in synchronism with the clock pulse Qn and with ¼ cycle advance phase difference. Accordingly, data is written in the address 0 of the EPROM.

Figure 10:
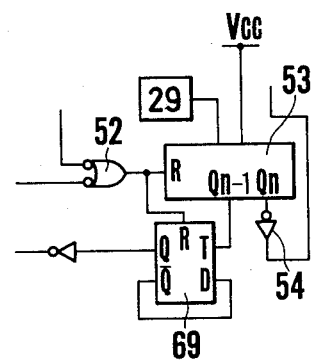
FIG. 10 shows another embodiment of the program pulse generator.
Figure 11:
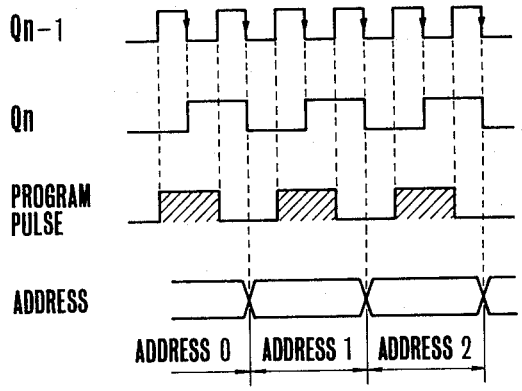
FIG. 11 shows a timing diagram of a program pulse according to the circuit of FIG. 10.

FIG. 10 shows an example of the program pulse generating circuit using a type-D flip-flop, timing diagram of which is shown in FIG. 11. The output Qn-1 of the binary counter 53 is generated through the type-D flip-flop 69 in synchronism with the output Qn and with ¼ cycle advanced phase difference. As will be seen from FIG. 11, the width of the program pulse is twice as long as the program pulse of FIG. 9. Therefore, the number of the program loop necessary to write-in from the RAM to EPROM is half as much as FIG. 9 and hence the time is half.

Figure 12:
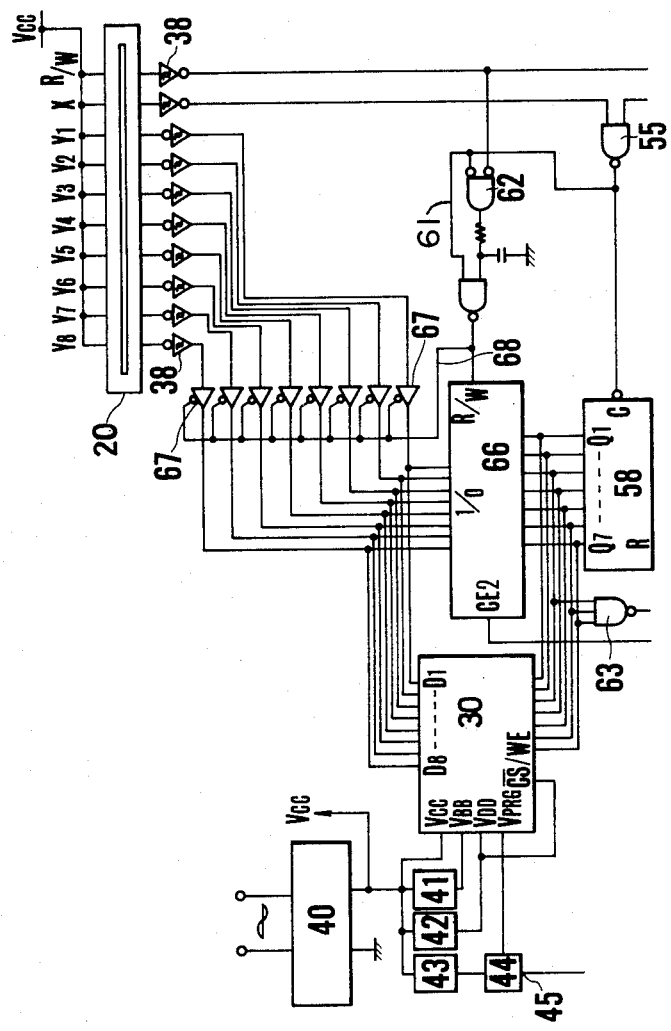
FIG. 12 shows another embodiment of the present invention.

FIG. 12 shows an example in which a RAM 66 having a common input and ouotut is used.

Input data buses are connected to the I/O lines of the RAM 66 through 3-state buffers 67 and output data buses are connected to data inputs D1, D2 . . . D8 of the EPROM 30. Each 3-state buffer 67 is controlled by a disable line 68. More particularly, when the disable line 68 is 1, the gate of the 3-state buffer 67 is closed and when the disable line 68 is 0, the gate of the 3-state buffer 67 is opened. Thus, in the write-in mode, data is written in memory cells in the RAM 66 through I/O lines in synchronism with the differentiation pulse synchronized with the write-in clock pulse. In the program mode, since the R/W line of the RAM 66 is held to 1, the gate of the 3-state buffer 67 is closed. Data written in the RAM 66 are programmed in addressed cells of the EPROM 30 in synchronism with the program pulse.

Figure 13:
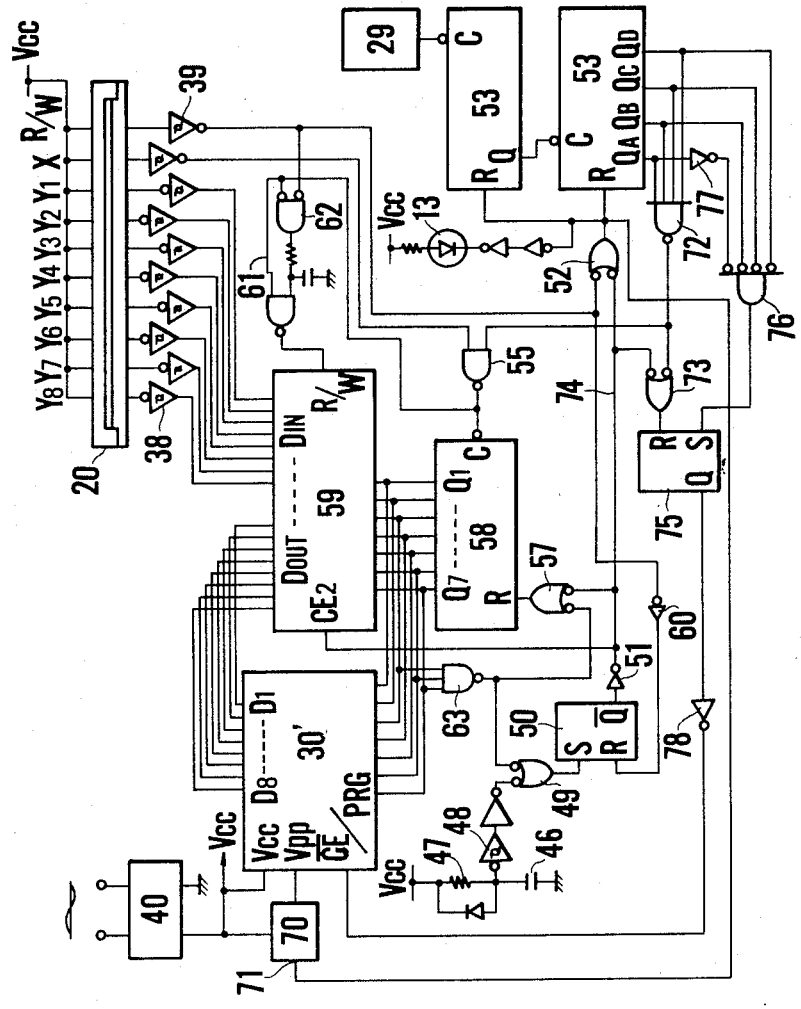
FIG. 13 shows a circuit having an EPROM operated by a single power source.

FIG. 13 shows another example of write-only sequence controller in which data are programmed in a read-only memory EPROM 30' operated by a single power source of +5 v. The system power source $V_{CC}$ is obtained by an AC/DC convertor and +25 V supplied to $V_{pp}$ of the EPROM 30' is obtained by a DC/DC convertor 70. When the input 71 of the convertor 70 is 0, +25 V is supplied to the $V_{pp}$ terminal, when the input is 1, the supply is stopped.

In the EPROM 30', a N-bit program is added at every addressing and the program is completed upon one loop. At that time, the width of the program pulse added to the terminal CE/PRG is about 50 ms per one address.

Figure 14:
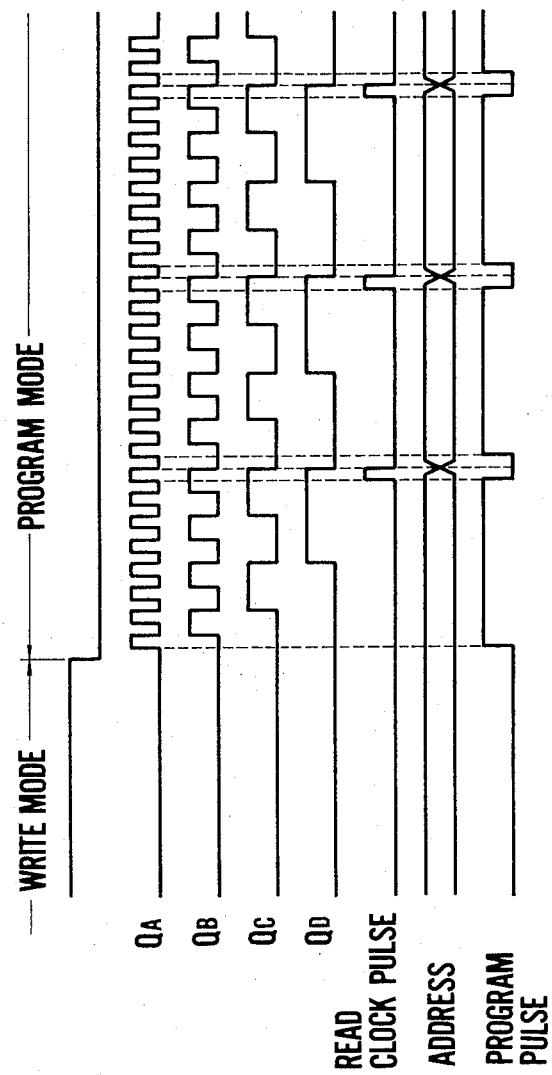
FIG. 14 shows a timing diagram of clock pulses.

Frequency of the crystal oscillator 29 is decided so as to obtain the program pulse of 50 ms. The frequency is divided by 2-stage binary counters 53 (not always two stages), divider outputs $Q_A$, $Q_B$, $Q_C$, and $Q_D$ of the binary counter are inputted in a 4-input NAND gate 72. In the write-in mode, the divider outputs are stopped, and in the program mode, pulses are generated from the outputs $Q_A$, $Q_B$, $Q_C$, and $Q_D$. As shown in FIG. 14, a read clock pulse is generated from the 4-input NAND gate 72 at every eight counts of $Q_A$.

The output of the gate 72 is connected to one of inputs of a 2-input NAND gate 73 and a line 74 is connected to the other input of the 2-input NAND gate 73. The output of the gate 73 is applied to reset R of a flip-flop 75.

Also, divider outputs $Q_A$, $Q_B$, $Q_C$ and $Q_D$ are inputted in a 4-input NAND gate 76. The $Q_A$ is connected to the gate 76 through an invertor 77. Therefore, during the term in which the divider outputs $Q_A$, $Q_B$, $Q_C$ and $Q_D$ change from 1111 to 1000, which is equal to one cycle of the output $Q_A$, the gate 76 produces output 0.

When the power is supplied, a differentiation pulse generated from integrating circuit comprising the capacitance 46 and resistor 47 is applied to the flip-flop 50 through the Schmitt trigger 48 and the invertor 49 to reset all of circuits.

Then, when program sheet is inserted into the sheet reader, the system is converted to the write-in mode. While the program sheet passes through the sheet reader, data are written in the RAM in synchronism with the write-in pulse. When the program sheet has passed the sheet reader, the system is automatically changed to the program mode. Since both inputs of the 2-input NAND gate 52 are 1's and the reset R of the binary counter 53 is 0, divider outputs $Q_A$, $Q_B$, $Q_C$ and $Q_D$ generate pulses. Read clock pulses are produced from the gate 72, program pulses are inputted in the terminal $\overline{CE/PRG}$ of the EPROM through the gate 76, flip-flop 75 and invertor 78.

Read clock pulses are inputted in the binary counter 58 through the gate 55, so that address cells of the RAM 9 and EPROM 30' corresponding to address lines Q1, Q2 . . . Q7 are addressed. And data written in the RAM are programmed in address cells of the EPROM 30' in synchronism with the program pulse.

When the binary counter counts one hundred of read clock pulses, the output of the gate 63 will go to 0. Thus, a 1 is applied to the flip-flop 50 through the gate 49 to reset all of circuits.

Since the line 74 goes to 0, a 1 is applied to the reset R of the flip-flop 75 through the gate 73. Thus, a 0 is inputted in the $\overline{CE}$/PRG, so that the EPROM may be extracted for that period.

PROBABILITY OF INDUSTRIAL EXPLOITATION

In the write-only photo-electric sequence controller according to the present invention, programming and modifying of data may be easily carried out. By inserting the program sheet into the controller and extracting the sheet from it, a plurality of data may be written in the EPROM. The controller may be made into a light weight, for example 450 gr and into a compact size. Thus, the controller is contributory to the automatization and energy saving for machines and apparatus in the wide industrial field.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A photo-electric write-only sequence controller whereby a transparent program sheet bearing information is inserted into, passed through and extracted from said controller, which comprises:
a sheet reading device defining a path along which said program sheet passes which includes a plurality of light-emitting elements disposed in the lateral direction at the entrance of said path and a plurality of light-receiving elements, each of which is corresponding to each of said light-emitting elements and arranged to generate write clock pulses data output and R/W signals when light from the corresponding light-emitting elements is interrupted by information on said program sheet;
a RAM for memorizing said data in synchronism with said write clock pulses;
an EPROM detachably connected with terminals for said RAM;
means for generating read clock pulses;
a first binary counter for counting said write clock pulses and for addressing said RAM and EPROM;
a second binary counter for counting said read clock pulses and for generating program pulses for writing data in said EPROM;
a first gate means responsive to a first mode of said R/W signal to render said RAM in the write-in state and responsive to the second mode of said R/W signal to change said RAM to a read-out state;
a second gate means responsive to a first mode of said R/W signal effective to set said first binary counter and to reset said second binary counter and to render said RAM in an enable state;
a third gate means for generating a signal for stopping the reading operation when the count of said binary counter reaches a predetermined number;
whereby data in said program sheet is written in said RAM as said program sheet is passed through said sheet-reading device and data stored in said RAM is automatically written in said EPROM after the program sheet has been passed through and extracted from said sheet-reading device.

2. The sequence controller of claim 1, wherein said transparent program sheet is a series of write clock marks and a plurality of data lines, which are formed of opaque material and arranged in the longitudinal direction of said sheet.

3. A photo-electric write-only sequence controller of claim 1 further comprising gate means characterized in that outputs of a plurality of photo-electric data switch units are connected to I/O bus line of a RAM and to data input bus lines of an EPROM through a 3-state buffer and the output of a differentiation pulse generating circuit is connected to an R/W line of a RAM and to a disable line for controlling the 3-state buffer.

4. A photo-electric write-only sequence controller of claim 1 further comprising a case including front and back panels and a pair of shells, each shell having longitudinal end portions, each longitudinal end portion of said shells being outwardly inclined with inwardly bent ends, the respective ends of each of said shells being abutted to each other and engaged in guide grooves formed in said front and back panels.

5. A photo-electric write-only sequence controller of claim 1 wherein said sheet reader comprises a light emitting panel having a plurality of light emitting elements and a light receiving panel having a plurality of light receiving elements, both panels being provided with printed-wiring boards and are engaged with a sliding insertion engagement so as to face each other to form a gap for passing said program sheet.

6. A photo-electric write-only sequence controller of claim 1 further comprising gate means characterized in that power sources $V_{CC}$, $V_{BB}$, $V_{DD}$, obtained by a switch regulator system are directly applied to corresponding terminals of a EPROM, $V_{PRG}$ obtained by setting-up the $V_{CC}$ is applied to a control circuit, and program pulses are inputted to $V_{PRG}$ of an EPROM through said control circuit in synchronism with the read clock pulse and in advance of it.

7. A photo-electric write-only sequence controller of claim 1 further comprising gate means characterized in that the output of a gate having divider output $Q_A$, $Q_B$, $Q_C$, and $Q_D$ as input is connected to the first input of a 2-input NAND gate, the output line of an invertor is connected to the second input of the 2-input NAND gate, the output of 2-input the NAND gate is connected to the reset terminal of a flip-flop, divider outputs $Q_B$, $Q_C$, $Q_D$ are connected to a gate, $Q_A$ is connected to the gate through an invertor, the output of the gate is applied to $\overline{CE}$/PRG of an EPROM through the flip-flop, a clock pulse is supplied from the gate to a binary counter through gates in the program mode so that a RAM and EPROM are addressed by corresponding address lines, and program pulses are applied to the $\overline{CE}$/PRG of the EPROM through the gate and flip-flop for programming the data written in the RAM to the EPROM.

8. A photo-electric write-only sequence controller of claim 1 further comprising gate means characterized in that a control input of a DC/DC convertor is connected to an output of a gate for controlling a binary counter, a signal 0 is inputted in the DC/DC convertor during the program mode for supplying the voltage to $V_{pp}$ of an EPROM, a signal 1 is inputted to the DC/DC convertor during the write-in mode and after programming for cutting the voltage to $V_{pp}$ of the EPROM.

* * * * *